(12) United States Patent
Liu et al.

(10) Patent No.: US 9,071,228 B2
(45) Date of Patent: Jun. 30, 2015

(54) BALUN

(71) Applicant: GE Medical Systems Global Technology Company, LLC, Waukesha, WI (US)

(72) Inventors: Yu Liu, Beijing (CN); Qibin Peng, Beijing (CN); Anmou Liao, Beijing (CN); Haoyang Xing, Beijing (CN); Chenxing Zhao, Beijing (CN); Hai Huang, Beijing (CN)

(73) Assignee: GE MEDICAL SYSTEMS GLOBAL TECHNOLOGY COMPANY, LLC, Waukesha, WI (US)

( * ) Notice: Subject to any disclaimer, the term of this patent is extended or adjusted under 35 U.S.C. 154(b) by 134 days.

(21) Appl. No.: 13/870,522

(22) Filed: Apr. 25, 2013

(65) Prior Publication Data

US 2013/0285760 A1 Oct. 31, 2013

(30) Foreign Application Priority Data

Apr. 27, 2012 (CN) .......................... 2012 1 0131123

(51) Int. Cl.
*H03H 5/00* (2006.01)
*H03H 7/42* (2006.01)
*H01P 5/10* (2006.01)

(52) U.S. Cl.
CPC ... *H03H 7/42* (2013.01); *H01P 5/10* (2013.01)

(58) Field of Classification Search
USPC ....................... 333/26, 25, 236–263
See application file for complete search history.

(56) References Cited

U.S. PATENT DOCUMENTS

| 2,925,566 | A | * | 2/1960 | Jasik ............................... 333/26 |
| 3,976,959 | A | | 8/1976 | Gaspari et al. |
| 4,121,180 | A | * | 10/1978 | Greenway ..................... 333/112 |
| 4,554,518 | A | * | 11/1985 | Baer ................................ 333/33 |
| 5,115,214 | A | * | 5/1992 | Gassmann et al. .............. 333/26 |
| 5,977,842 | A | * | 11/1999 | Brown et al. .................... 333/26 |
| 5,982,252 | A | * | 11/1999 | Werlau .......................... 333/127 |
| 6,531,943 | B2 | | 3/2003 | Niu et al. |
| 2011/0267062 | A1 | * | 11/2011 | Otake et al. ................... 324/322 |

* cited by examiner

*Primary Examiner* — Lincoln Donovan
*Assistant Examiner* — Thomas Skibinski
(74) *Attorney, Agent, or Firm* — GE Global Patent Operation; Marc A. Vivenzio

(57) ABSTRACT

Embodiments of the present invention relate to the technical field of RF circuits, and in particular, to a balun. In an embodiment of the present invention, a balun is provided which comprises at least two coaxial cables, each of which is wound into at least one loop, and the inner and outer conductors of one end of all coaxial cables are connected respectively to each other and the inner and outer conductors of the other end are also connected to each other. The novel balun according to the embodiments of the present invention has a small size but a large power capacity and low cost, and can be used in a magnetic field environment.

6 Claims, 3 Drawing Sheets

BALUN

BACKGROUND TO THE INVENTION

This invention relates to the technical field of circuits, and in particular, to a balun.

In general, a RF power amplifier usually uses a push-pull circuit. FIG. 1 shows a typical push-pull circuit. In the circuit, a balun (also known as balanced feeding converter or transmission line balancing device) is an indispensable component, wherein the input balun 1 is used to convert the signal on the unbalanced transmission line into a balanced input for the power amplifier, while the output balun 2 is used to convert the balanced output of the power amplifier onto an unbalanced load.

Above a S wave band, a balun can be implemented by using a ¼ wavelength transmission line easily, but for a UHF, VHF and even lower wave bands, because of longer wavelength, and limited by size, it can hardly be realized in this manner. The practice in the prior art is using ferrite material to realize the balun.

Some RF power amplifiers need to be used in a magnetic field environment, e.g., the RF power amplifier on a nuclear magnetic resonance (MR) device. The balun containing ferrite material cannot be used in a magnetic field environment, because the ferrite material may cause magnetic saturation.

The nuclear magnetic resonance device also has a pretty high requirement on the size and power capacity of the balun.

U.S. Pat. No. 3,976,959 discloses a balun, which comprises a flat insulating component, and a ground plane constructed by a conductor in the center of the insulating component, the conductor divides the insulating component into three parts, and further divides the received waveguide energy into two equiphase parts. The conductor can also recombine the signals of the two equiphase parts, and generate an output waveguide signal by a predefined phase relationship. In concrete implementation, micro strips and strip lines are employed. Its shortcoming is that the size will grow when used at a low frequency range, so is not applicable to the low frequency range application.

U.S. Pat. No. 6,531,943 discloses another structure of balun, which specifically comprises two structures. The first structure is using a coplanar waveguide and a coplanar strip line to realize the conversion between the balanced end and the unbalanced end, and this structure can be used in application scenarios from several MHz to 10 GHz: the second structure is a simplification based on the first one, using only a coplanar strip line, the node of an input end of the strip line is connected to ground, and the signal of its output end keeps a 180 degrees of phase difference, in addition, it further comprises a impedance matching circuit. This structure can be used in application scenarios from several MHz to 2 GHz. These two structures both have the same shortcoming; which include lower power capacity, and are not applicable to high power situations.

BRIEF DESCRIPTION OF THE INVENTION

In accordance with an embodiment of the present invention, a balun is provided. The balun comprises at least two coaxial cables wound into at least one loop, and each of the coaxial cables comprises an inner conductor and an outer conductor. The respective inner and outer conductors at one end of each of the at least two coaxial cables are connected together, and the respective inner and outer conductors at the other end of each of the at least two coaxial cables are connected together.

DETAILED DESCRIPTION OF THE INVENTION

Following is a further explanation of embodiments of the present invention in combination with figures.

In accordance with an embodiment of the present invention, a balun comprising at least two coaxial cables 101 and 102 is provided. In at least one embodiment, the coaxial cables are 50 ohm coaxial cables each having a length of approximately 40 cm; however, as would be recognized by those having ordinary skill in the art, the ohm rating and/or the length of the cables may be varied as required.

Figure 1:
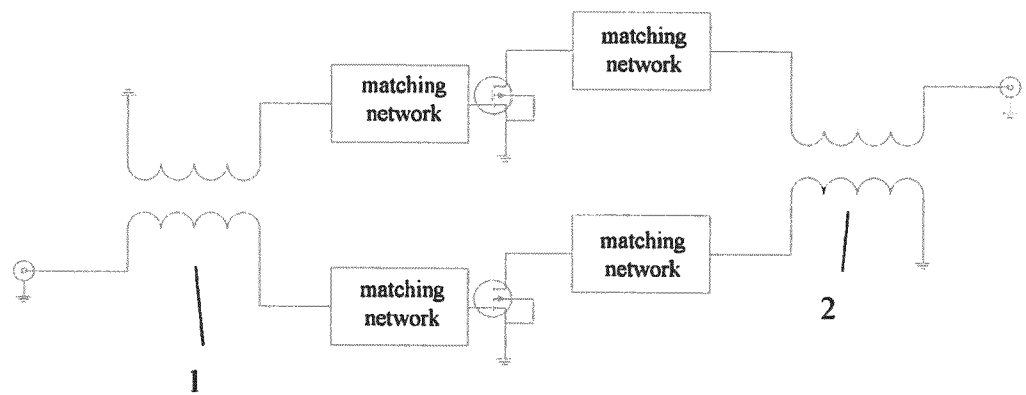
FIG. 1 is a schematic diagram of a typical push-pull circuit.
Figure 3:
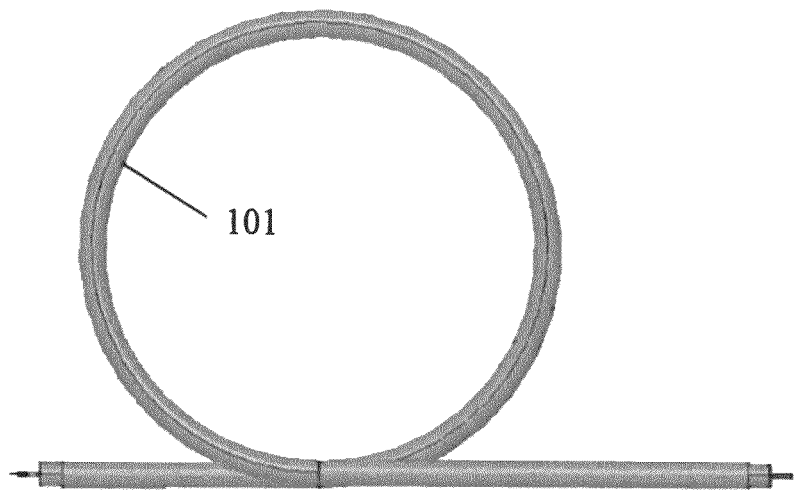
FIG. 3 is a schematic diagram of the winding shape of any one of the coaxial cables in the balun according to an embodiment of the present invention.

As shown in FIG. 1, at least two coaxial cables 101 and 102 are arranged closely together and wound into at least one loop. In some embodiments, the at least two coaxial cables 101 and 102 are wound in the shape/form of a helix comprising at least three loops. In some embodiments, the winding shape of each loop of coaxial cables may take the form of a circle as shown in FIG. 3; however, the shape of each loop can take the form of any of numerous shapes known to those skilled in the art such as, for example, an oval shape. In some such embodiments, at least two adjacent loops of the helix are closely arranged together. And in some such embodiments, the helix has three circular loops, each loop having a diameter of approximately 25 mm.

Figure 2:
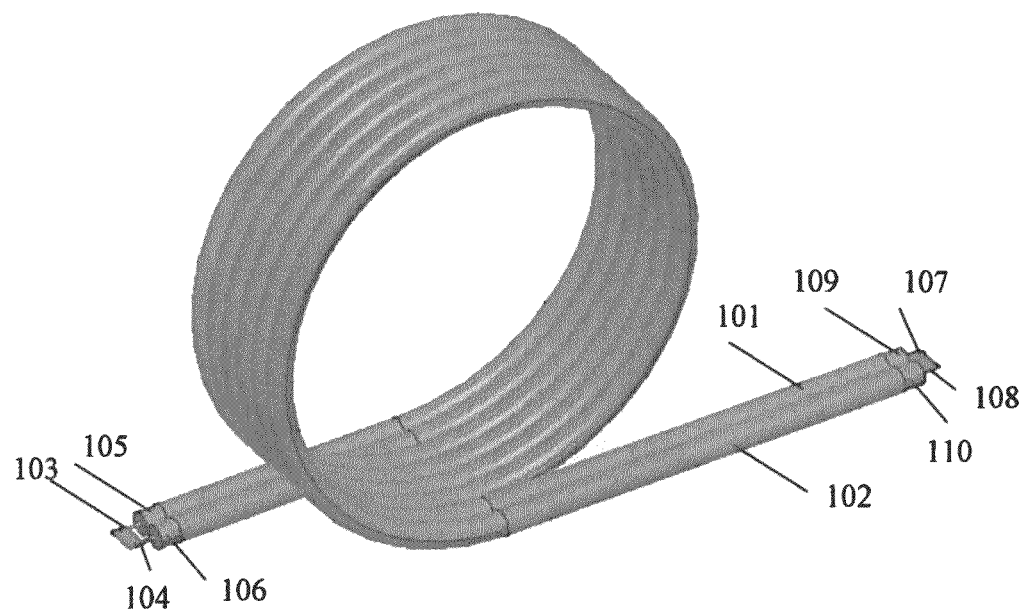
FIG. 2 is a schematic diagram of the overall structure of a balun according to an embodiment of the present invention.
Figure 4:
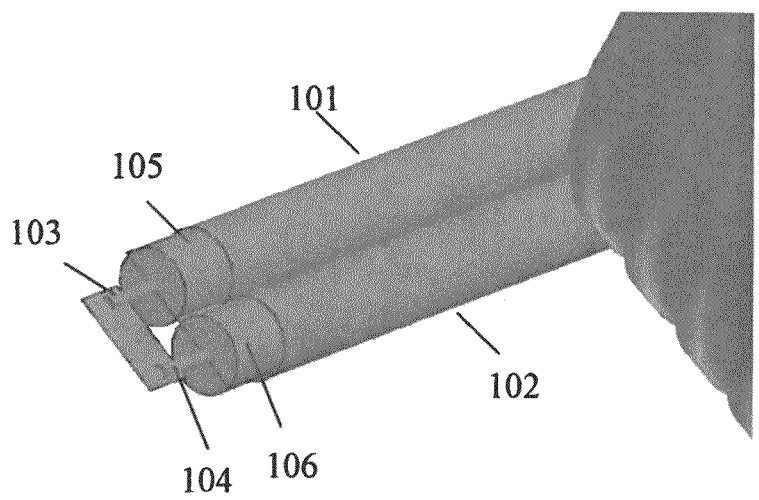
FIG. 4 is a schematic diagram of the connection manner of any one end of the balun according to an embodiment of the present invention.

As shown in FIG. 2 and FIG. 4, the inner conductors 103 and 104 of one end of the coaxial cables 101 and 102 are welded together, and the outer conductors 105 and 106 of this end are also welded together. The inner conductors 107 and 108 of the other end of the coaxial cables 101 and 102 are welded together, and the outer conductors 109 and 110 of this end are also welded together. The two coaxial cables are connected in parallel.

When the balun is connected with an outside device, any one end of the above welded two ends serve as a balanced end, while the other end serves as an unbalanced end. For example, when the one end where the inner conductors 103, 104 and outer conductors 105, 106 are located serves as the balanced end, the welded inner conductors 103, 104 and outer conductors 105, 106 are connected respectively to two signals whose phase difference is 180 degrees. The other end where the inner conductors 107, 108 and outer conductors 109, 110 are located serves as the unbalanced end. The welded inner conductors 107, 108 are connected to a signal, and the welded outer conductors 109, 110 are connected to ground.

When producing a balun, it is feasible to adopt multiple coaxial cables for winding the balun, so as to enhance the power capacity thereof. On the premise of increasing the number of cables, thinner cables can be used to achieve the same power capacity. Each coaxial cable may be wound into a circular or oval shape. The diameter of a circular loop is the minimum corner radius of the selected coaxial cable.

Figure 5:
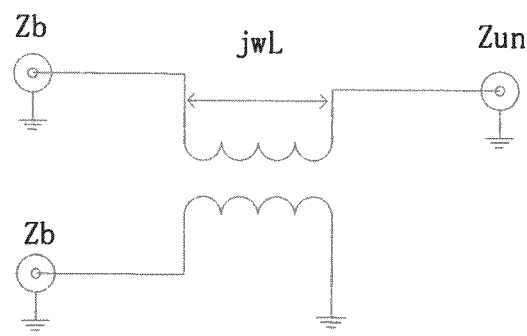
FIG. 5 illustrates an impedance value of the balun according to an embodiment of the present invention.

Each cable's length and number of loops to be wound are related to the impedance at both ends of the balun. The inductor impedance jωL of the balun after winding is greater than the product of 4 (four) multiplied by the impedance value of the one end having the maximum impedance among the two ends of the balun. As shown in FIG. 5, jωL>4×MAX(Zb, Zun). For example, in the above instance, when the one end where the inner conductors 103, 104 and outer conductors 105, 106 are located serves as the balanced end, its impedance is 25 ohm; and when the other end where the inner conductors 107, 108 and outer conductors 109, 110 are located serves as the unbalanced end, its impedance is 12.5 ohm. Therefore, when the balun has finished winding, its impedance should be greater than 100 ohm (4*25). In actual production, an RF meter may be employed to measure the balance of the wound balun, so as to determine if the requirement is met.

In accordance with an embodiment of the present invention, the inner and outer conductors of one end of all coaxial cables are connected respectively to two signals having a phase difference of 180 degrees; the inner conductor of the other end is connected to a signal, the outer conductor is connected to a ground.

In accordance with an embodiment of the present invention, a balun is provided wherein the loop formed by the coaxial cables is circular or oval.

In accordance with an embodiment of the present invention, a balun is provided wherein the coaxial cables comprises 50 ohm and 75 ohm.

In accordance with an embodiment of the present invention, a balun is provided wherein the impedance of the balun is greater than the product of 4 (four) multiplied by the impedance value of the end having larger impedance among the two ends of the balun.

Embodiments of the present invention provide a novel balun, whose beneficial effects comprises usability in magnetic field environment wherein it can be used in a magnetic field environment because it contains no magnetic parts, and small is size wherein it adopts the manner of standard parallel connection of coaxial cables. In addition, the characteristic impedance of the cables is reduced, as well as the impedance of the balanced port and unbalanced port. Therefore, on the premise of ensuring the same balance, the number of coil windings is reduced, thus reducing the size of the whole balun. Beneficial effects of the present invention further comprises a higher power capacity wherein the balun can use coaxial cables in parallel to improve the power capacity, and low cost wherein it is manufactured only by using common coaxial cables comprising 50 ohm and 75 ohm.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A balun comprising:
   at least two coaxial cables wound into at least one loop;
   each of the at least two coaxial cables comprises an inner conductor and an outer conductor; and
   the respective inner and outer conductors at one end of each of the at least two coaxial cables are connected together, and the respective inner and outer conductors at another end of each of the at least two coaxial cables are connected together,
   wherein the inner and outer conductors at one end of each of the at least two coaxial cables are connected to two signals having a phase difference of about 180 degrees, and the inner conductor at the other end of each of the at least two coaxial cables is connected to a signal while the outer conductor of each of the at least two coaxial cables is connected to a ground.

2. The balun according to claim 1, wherein the loop is circular or oval.

3. The balun according to claim 1, wherein the coaxial cables are 50 ohm or 75 ohm.

4. A balun comprising:
   at least two coaxial cables wound into at least one loop;
   each of the at least two coaxial cables comprises an inner conductor and an outer conductor; and
   the respective inner and outer conductors at one end of each of the at least two coaxial cables are connected together, and the respective inner and outer conductors at another end of each of the at least two coaxial cables are connected together,
   wherein the balun comprises two ends and one of the ends has a greater impendence value relative to the other of the ends, and the impedance of the balun is greater than the product of four multiplied by the impedance value of the end of the balun having the greater impedance value.

5. The balun according to claim 4, wherein the loop is circular or oval.

6. The balun according to claim 4, wherein the coaxial cables are 50 ohm or 75 ohm.

* * * * *